(12) United States Patent
Hung

(10) Patent No.: US 8,159,063 B2
(45) Date of Patent: Apr. 17, 2012

(54) SUBSTRATE AND PACKAGE WITH MICRO BGA CONFIGURATION

(75) Inventor: Ching-Wei Hung, Hsinchu (TW)

(73) Assignee: Powertech Technology Inc., Hukou Shiang, Hsinchu (TW)

( * ) Notice: Subject to any disclaimer, the term of this patent is extended or adjusted under 35 U.S.C. 154(b) by 401 days.

(21) Appl. No.: 12/612,279

(22) Filed: Nov. 4, 2009

(65) Prior Publication Data

US 2011/0062577 A1 Mar. 17, 2011

(51) Int. Cl.
*H01L 23/48* (2006.01)
*H01L 23/52* (2006.01)
*H01L 21/00* (2006.01)

(52) U.S. Cl. ........ 257/693; 257/694; 257/695; 257/696; 257/697; 257/738; 257/E23.069; 438/123

(58) Field of Classification Search .......... 257/693–697, 257/738; 438/123
See application file for complete search history.

(56) References Cited

U.S. PATENT DOCUMENTS

| | | | | |
|---|---|---|---|---|
| 5,668,405 A | * | 9/1997 | Yamashita | 257/668 |
| 5,706,174 A | * | 1/1998 | Distefano et al. | 361/749 |
| 6,239,384 B1 | * | 5/2001 | Smith et al. | 174/261 |
| 6,329,607 B1 | * | 12/2001 | Fjelstad et al. | 174/261 |
| 6,664,135 B2 | * | 12/2003 | Miyazaki et al. | 438/123 |
| 6,670,215 B2 | * | 12/2003 | Miyazaki et al. | 438/106 |
| 6,856,007 B2 | | 2/2005 | Warner | |
| 2002/0151111 A1 | * | 10/2002 | DiStefano et al. | 438/123 |
| 2006/0261494 A1 | * | 11/2006 | Miyazaki et al. | 257/779 |
| 2009/0111003 A1 | * | 4/2009 | Kim et al. | 429/53 |

* cited by examiner

*Primary Examiner* — Zandra Smith
*Assistant Examiner* — Jeremy Joy
(74) *Attorney, Agent, or Firm* — Muncy, Geissler, Olds & Lowe, PLLC

(57) ABSTRACT

A substrate of a micro-BGA package is revealed, primarily comprising a substrate core, a first trace, and a second trace where the substrate core has a slot formed between a first board part and a second board part. The first trace is disposed on the first board part and has a suspended inner lead extended into the slot where the inner lead has an assumed broken point. The second trace is disposed on the second board part and is integrally connected to the inner lead at the assumed broken point. More particularly, a non-circular through hole is formed at the assumed broken point and has two symmetric V-notches away from each other and facing toward two opposing external sides of the inner lead so that the inner lead at two opposing external sides does not have the conventional V-notches cutting into the inner lead from outside. Moreover, the inner lead will not unexpectedly be broken and the inner lead can easily and accurately be broken at the assumed broken point during thermal compression processes.

15 Claims, 6 Drawing Sheets

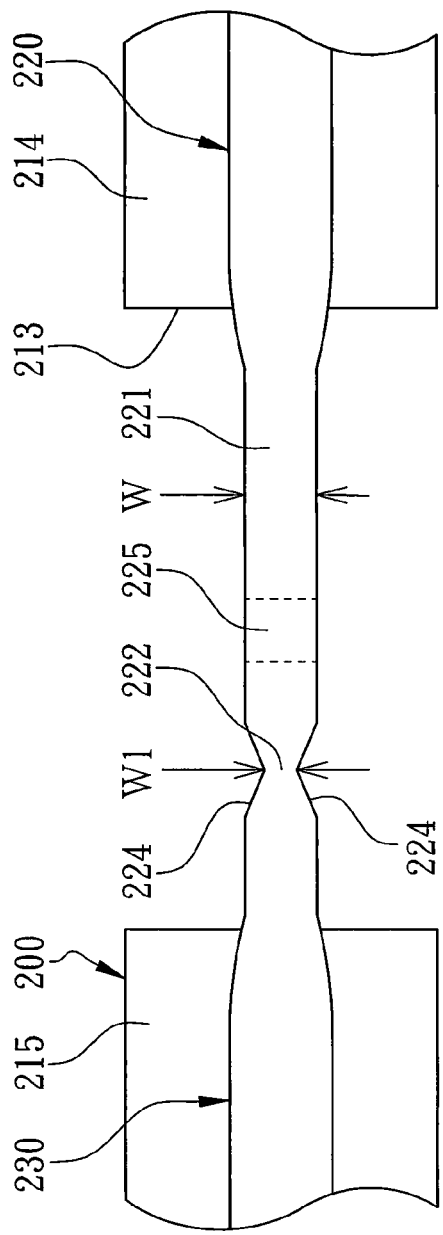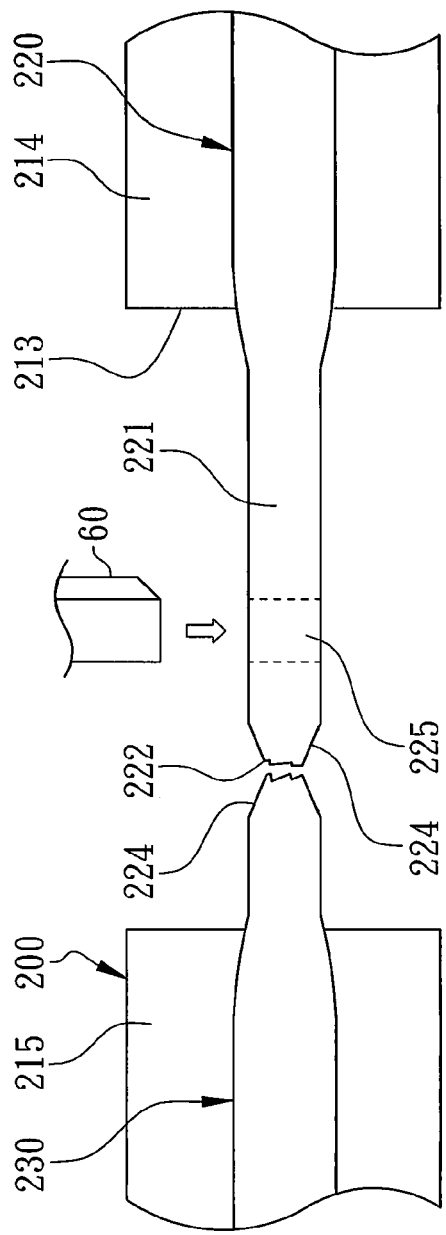
FIG. 3A (PRIOR ART)
FIG. 3B (PRIOR ART)

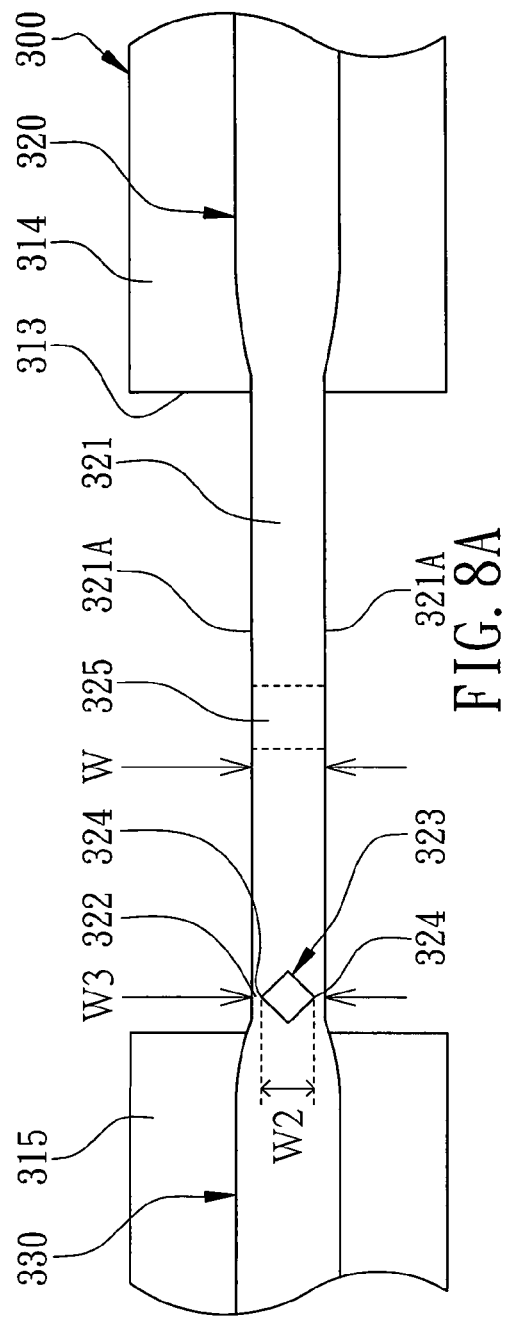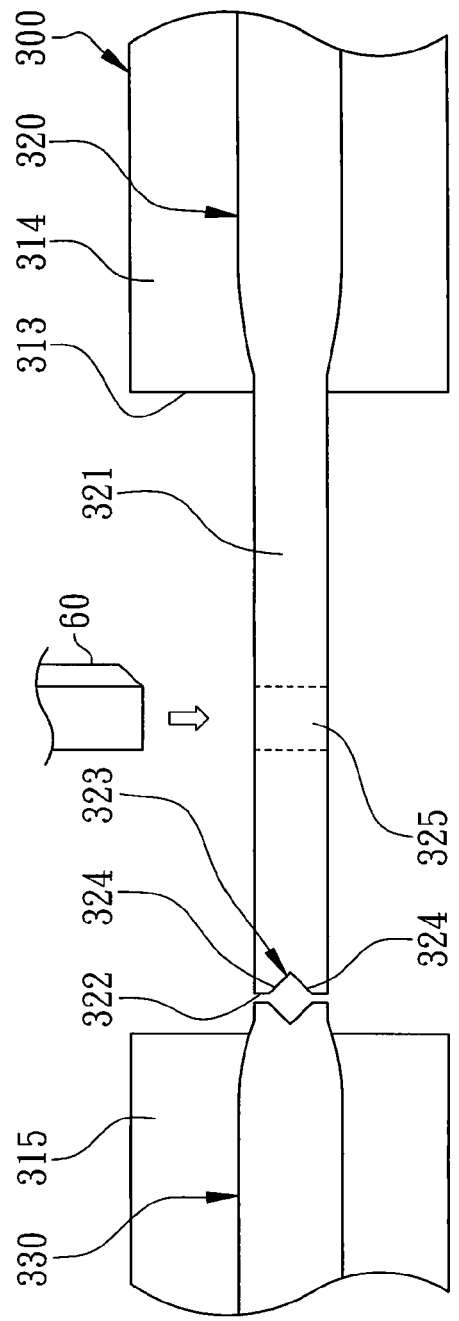

ID configuration.

SUBSTRATE AND PACKAGE WITH MICRO BGA CONFIGURATION

FIELD OF THE INVENTION

The present invention relates to a semiconductor device, and more particularly to the substrate and package with micro-BGA configuration.

BACKGROUND OF THE INVENTION

The trend of semiconductor packages is always developing toward thinner, lighter, shorter, and smaller with the requirement of cost reduction. Bonding pads of conventional semiconductor chips are used as external electrodes where bonding wires are used to electrically connect a chip to a substrate. However, the bonding wires have a loop height. As shown in FIG. 1, metal wires formed by wire bonding are implemented as electrical connections in a conventional package structure 1 such as FBGA or window BGA where a substrate 100 serves as a chip carrier with internal electrical connections. The substrate 100 with internal circuitry (not shown in the figure) has a top surface 111, a bottom surface 112, and a slot 113. A plurality of external pads 114 are disposed on the bottom surface 112 for disposing a plurality of external terminals 50 such as solder balls. The active surface 111 of a chip 10 is attached to the top surface 111 of the substrate 100 through a die-attaching layer 20 such as epoxy, adhesive paste or a film with the bonding pads 12 disposed on the active surface 11 exposed from and aligned in the slot 113. A plurality of metal wires 30 formed by wire bonding pass through the slot 113 to electrically connect the bonding pads 12 of the chip 10 to internal fingers of the substrate 100. An encapsulant 40 is implemented to encapsulate the chip 10 and the metal wires 30 except the external pads 114 to avoid external contaminations. The external terminals 50 are disposed on the external pads 114 as external soldering points.

Since metal wires 30 formed by wire bonding are implemented in the conventional FBGA package 1 as electrical connections between the chip 10 and the substrate 100 where each metal wire 30 has two metal bonding interfaces with a higher loop height leading to signal delay which is not suitable for high-frequency IC packages, especially for DDR3 or IC packages with operation frequencies more than 500 MHz.

As shown in FIG. 2, inner leads built in a substrate are implemented as electrical connections in another conventional package 2 such as a micro-BGA package where a substrate 200 serves as a chip carrier with internal electrical connections. The substrate 200 is a wiring board with a thinner thickness such as a flexible film. The substrate 200 includes a substrate core 210, a first trace 220, and a second trace 230. The substrate core 210 has a slot 213 and a first board part 214 and a second board part 215 located at two opposing sides of the slot 213 where the slot 213 penetrates through and locates at the center the substrate core 210. The first trace 220 is disposed on the first board part 214 and has a suspended inner lead 221 extended into the slot 213 where the inner lead 221 is the suspended integral part of the first trace 220 which is normally made of copper and is an internal component of the substrate 200. Furthermore, as shown in FIG. 2, the substrate core 210 further has a top surface 211 and a bottom surface 212 where a plurality of external pads 226 are disposed on the bottom surface 212 and electrically connected with the corresponding first trace 220. A solder mask 240 is formed on the bottom surface 212 of the substrate core 210 to cover the first trace 220 and the second trace 230 with the inner leads 221 and the external pads 226 exposed.

As shown in FIG. 2 again, the active surface 11 of a chip 10 is attached to the substrate 200, i.e., the top surface 211 of the substrate core 210, through an elastomer 250 with the bonding pads 12 exposed from and aligned in the slot 213. The inner lead 221 is then bent through the slot 213 and thermally bonded to the bonding pads 12 of the chip 10 through conventional ILB (Inner Lead Bonding) without any extra components for external electrical connections such as metal wires formed by wire bonding to electrically connect the chip 10 to the substrate 200 where there is no loop height with only one metal bonding interface from bonding pads of the chip to the circuitry of a substrate so that the signal path can be shortened for high-frequency IC packages. An encapsulant 40 is implemented to encapsulate the chip 10 and the inner leads 221 to avoid external contaminations. A plurality of external terminals 50 such as solder balls are then disposed on the external pads 226 of the substrate 200 as external soldering points.

Since the inner leads 221 are suspended in the slot 213, the inner leads 221 need firmly fixed before assembly to avoid sweeping and misalignment. As shown in FIG. 3A, the inner lead 221 has an assumed broken point 222. The second trace 230 is disposed on the second board part 215 and is integrally connected to the inner leads 221 at the assumed broken point 222 to achieve fixing of the inner leads 221 before bonding. In order to enhance easy breaking of the inner leads 221 at the assumed broken point 222, two symmetric V-notches 224 are formed at two corresponding external sides of the inner leads 221 so that the width W1 of the assumed broken point 222 is smaller than the width W of the inner lead 221.

As shown in FIG. 3B, thermal compression of the inner lead 221 is illustrated where a thermal-compression bonding head 60 is aligned to and pressed at the assumed bonding location 225 defined on the inner lead 221 to bond the inner lead 221 to the bonding pad 12. During thermal compression bonding processes, the inner lead 221 is expected to break at the assumed broken point 222 to form an ideal crack from the upper V-notches 224 to the lower V-notch 224. However, the crack at the assumed broken point 222 after thermal compression in actual operation is irregular and not easy to break. Therefore, in order to prevent irregular breaking of the assumed broken point 222, the assumed broken point 222 is disposed close to the assumed bonding location 225 and the depth of the V-notches 224 has to be increased, i.e., to reduce the width of W1. However, the assumed broken point 222 becomes a stress concentrated point and is easily broken at the unexpected time such as shipping or operation. Furthermore, when the assumed broken point 222 is too close to from the assumed bonding location 225, the thicknesses of the substrate 200 and the elastomer 250 will impact the effective bonding area of the inner leads 221 to the bonding pads 12 leading to poor thermal-compression bonding.

SUMMARY OF THE INVENTION

The main purpose of the present invention is to provide a substrate and package of a micro-BGA package to avoid stresses concentrated at the assumed broken points of the inner leads to resolve the unexpected broken inner leads.

The second purpose of the present invention is to provide a substrate and package of a micro-BGA package to assure that the breaking of inner leads during ILB bonding is easy and exactly at the assumed broken point and to increase the length between the assumed broken point and the assumed bonding location of inner leads to effectively bonding to the bonding pads of a chip to enhance the quality of electrical connections.

According to the present invention, a substrate and package of a micro-BGA package is revealed, primarily comprising a substrate core, a first trace, and a second trace. The substrate core has a central slot and a first board part and a second board part disposed at two opposing sides of the slot. The first trace is disposed on the first board part with a suspended inner lead extended into the slot where the inner lead has an assumed broken point. The second trace is disposed on the second board part and is integrally connected with the inner lead at the assumed broken point. A non-circular through hole is formed at the assumed broken point through the inner lead and has two symmetric V-notches away from each other and facing toward two corresponding external sides of the inner lead.

The substrate and package of a micro-BGA package according to the present invention has the following advantages and functions:

1. Since the through hole at the assumed broken point has two symmetric V-notches away from each other and facing toward two corresponding external sides of the inner lead as a technical mean, both sides of the assumed broken point of the inner lead will not have the conventional unexpected crack so that the width of the inner lead at the assumed broken point is equivalent to or not smaller than the width at other portion of the inner lead to resolve the conventional breaking issues of inner leads at the unexpected time.
2. Through the formation of non-circular through hole at the assumed broken point as a technical mean, the assumed broken point can break into two or more cross-sections so that the breaking of the inner lead during ILB bonding is easy and exactly at the assumed broken point and the lead length from the assumed broken point to the assumed bonding location of the inner lead can be increased to effectively bond to the bonding pads of a chip to enhance the quality of electrical connections

DESCRIPTION OF THE DRAWINGS

FIGS. 3A and 3B are partial top views of an inner lead on a substrate of a conventional micro-BGA package before and after thermal compression during ILB bonding.

FIG. 8A to 8B are partial top views of an inner lead of a substrate of a micro-BGA package before and after thermal compression during ILB bonding according to the preferred embodiment of the present invention.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
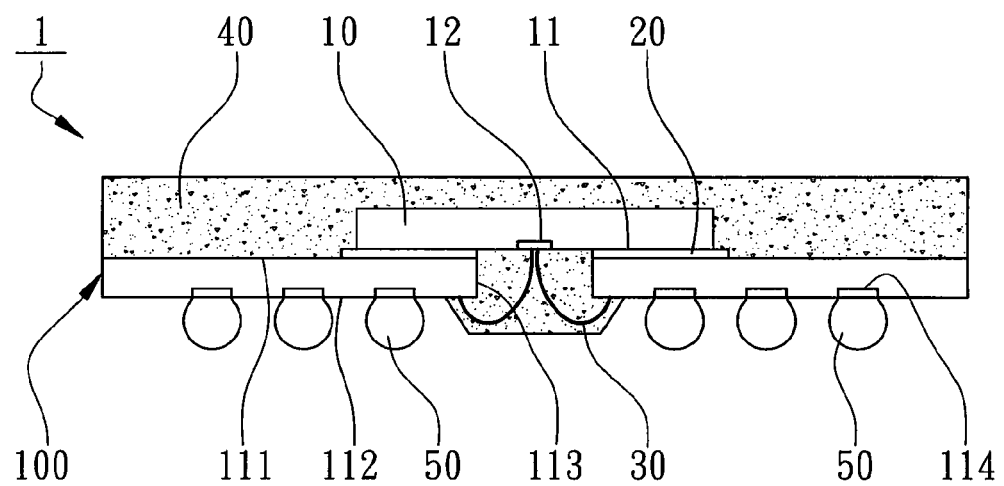
FIG. 1 is a cross-sectional view of a conventional window BGA package.
Figure 2:
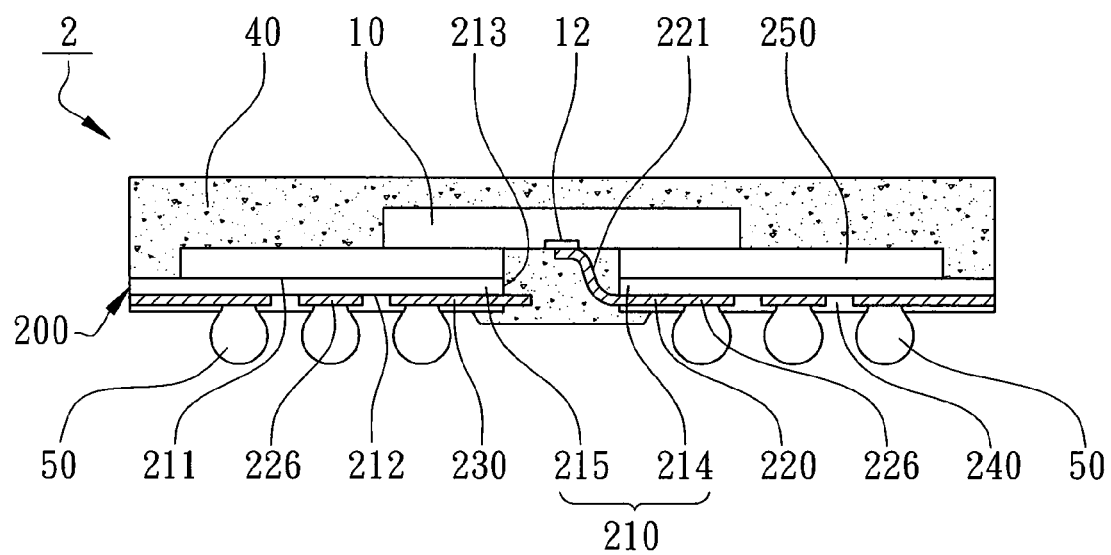
FIG. 2 is a cross-sectional view of another conventional micro-BGA package.
Figure 4:
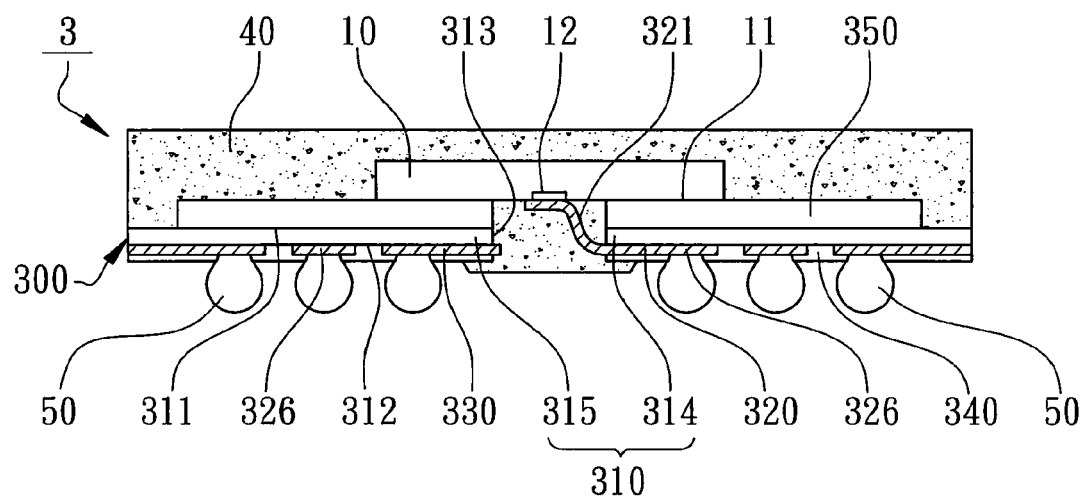
FIG. 4 is a cross-sectional view of a micro-BGA package according to the preferred embodiment of the present invention.
Figure 5:
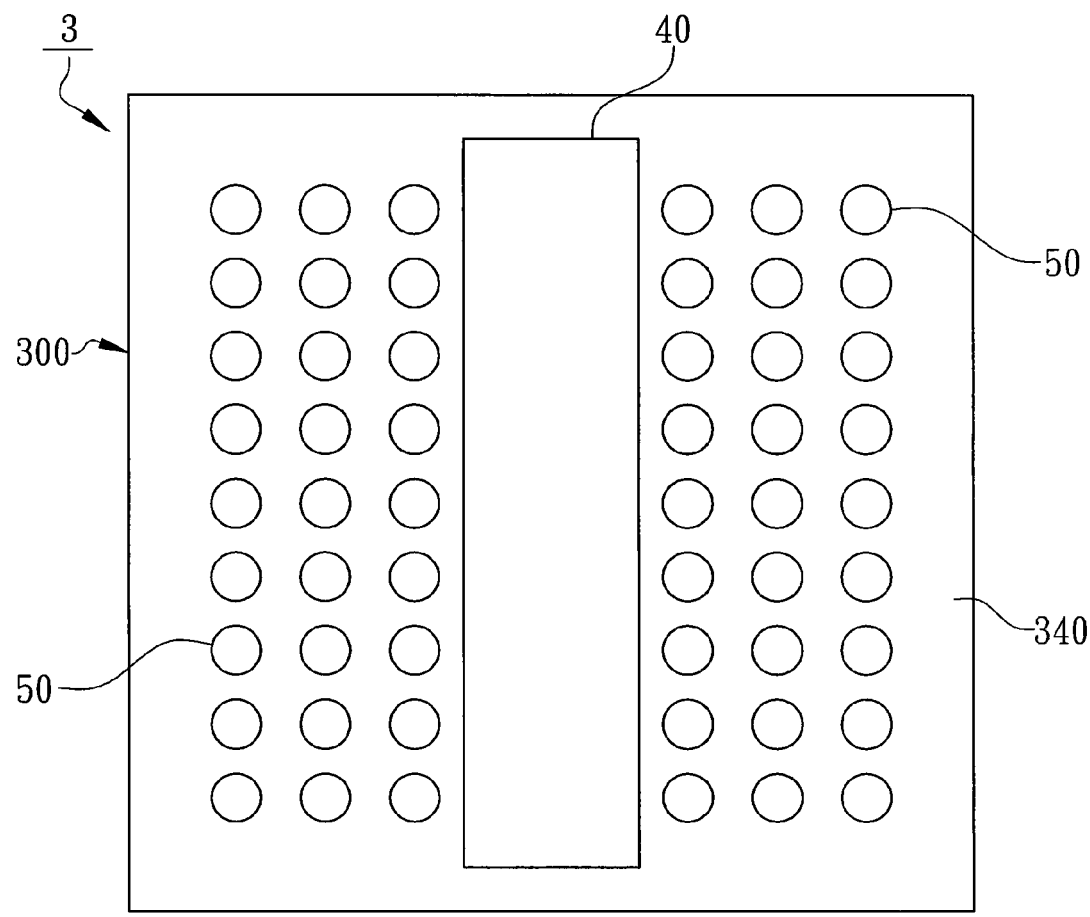
FIG. 5 is a bottom view of a micro-BGA package according to the preferred embodiment of the present invention.

According to the preferred embodiment of the present invention, a micro-BGA package is illustrated in FIG. 4 for a cross-sectional view and in FIG. 5 for a bottom view. The micro-BGA package 3 primarily comprises a substrate 300 and a chip 10 where the active surface 11 of the chip 10 is disposed on the substrate 300 and the chip 10 has a bonding pad 12 on the active surface 11. As a matter of fact, as shown in FIG. 4, the bonding pad 12 is just one of central bonding pads arranged along a straight line which is not limited to just only one bonding pad.

The substrate 300 primarily comprises a substrate core 310, a first trace 320, and a second trace 330 where the substrate core 310 has a top surface 311, a corresponding bottom surface 312 and a central slot 313. The substrate core 310 consists of a first board part 314 and a second board part 315 where the slot 313 is formed between the two board parts 314 and 315. The substrate core 310 can be a printed circuit board made of FR-4, FR-5, or BT resin or a flexible film made of PI. Preferably, the substrate core 310 is a flexible film with a thinner thickness. The shape of the slot 313 is a long strip to penetrate through the substrate core 310 and to locate at the center of the substrate core 310. After die attaching, the bonding pad 12 is aligned within the slot 313. In real products, there are a plurality of the first traces 320 and the second traces 330.

The first trace 320 is disposed on the first board part 314 having a suspended inner lead 321 extended into the slot 313. The second trace 330 is disposed on the second board part 315. The first trace 320 and the second trace 330 are corresponding to and integrally connected to each other before packaging processes where an assumed broken point 322 is disposed at the intersection between the inner lead 321 of the first trace 320 and the second trace 330, as shown in FIG. 8A. The assumed broken point 322 will break at the assumed broken point 322 by a thermal compression head 60 during ILB bonding or thermal compression of packaging processes, as shown in FIG. 8B, so that the broken inner lead 321 can be bent through the slot 313 and bonded to the bonding pad 12, as shown in FIG. 4. Therefore, the inner lead 321 is an electrically connecting component built in the substrate 300 to replace a conventional bonding wire. The inner lead 321 integrally connects with the first trace 320 without metal bonding interface for electrical connection of the chip 10 to the substrate 300. Before thermal compression, the inner lead 321 of the first trace 320 is firmly fixed by the second trace 330 where the shape of the second trace 330 can be a line, an island, or a finger.

In the present embodiment, the first trace 320 and the second trace 330 are formed on the bottom surface 312 of the substrate core 310 where the first trace 320 and the second trace 330 can be formed from a same circuitry to decrease circuitry layers to reduce the cost. The circuitry further comprises an external pad 325 electrically connected with the corresponding first trace 320. Therefore, the first trace 320 including the inner lead 321 and the second trace 330 are parts of the internal circuitry of the substrate 300 but not extra added components where the internal circuitry of the substrate 300 is normally a plated copper trace. As shown in FIG.

4, the external pad 326 can be disposed and arranged in an array on the bottom surface 312 for disposing an external terminal 50 for external electrical connection. In the present embodiment, the external terminal 50 is a solder ball to form a micro-BGA package 3 to enable the chip 10 assembled inside the micro-BGA package 3 to electrically connect to an external printed circuit board, not shown in the figure.

Figure 6:
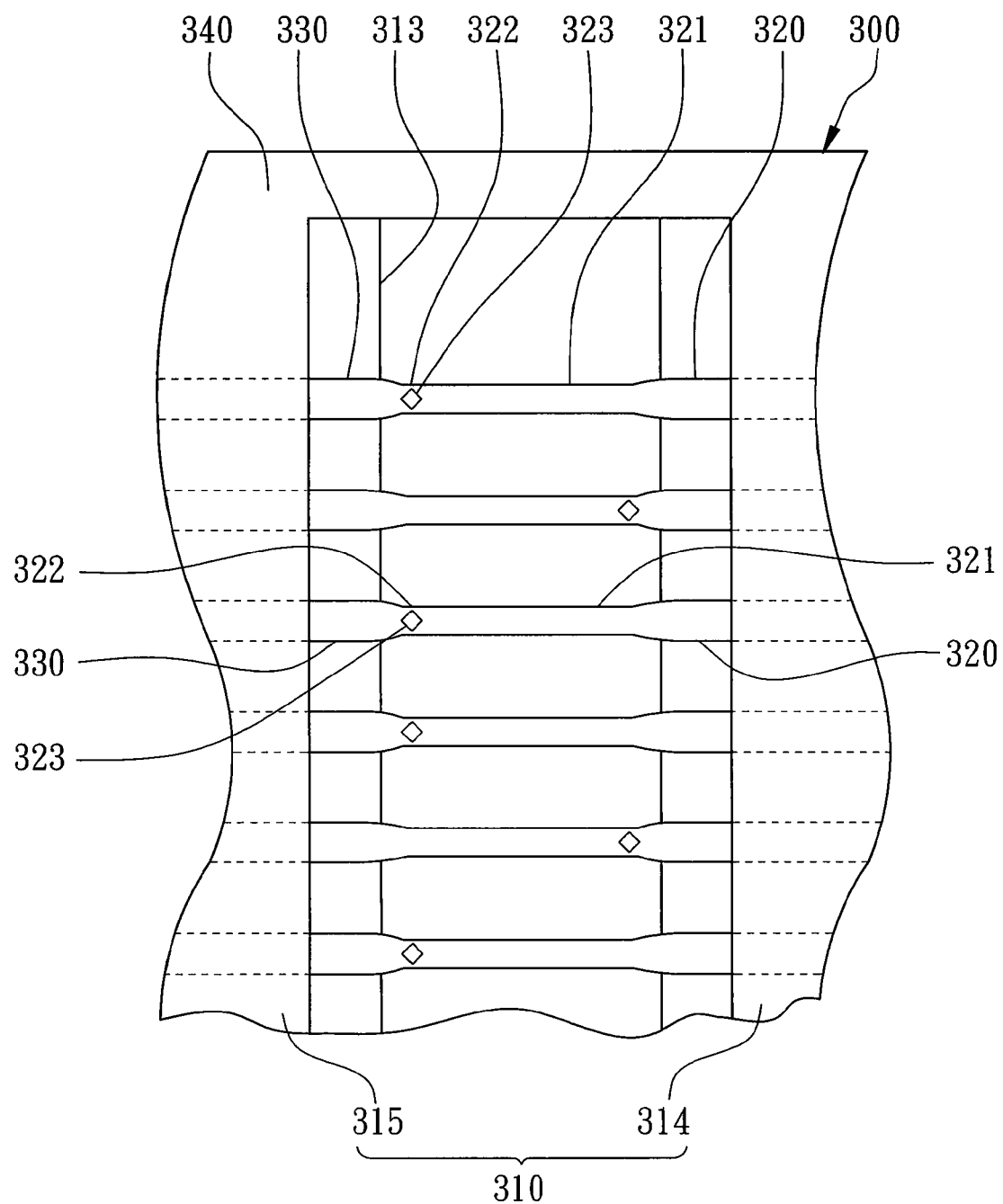
FIG. 6 is a partial bottom view of a slot of a substrate of a micro-BGA package according to the preferred embodiment of the present invention.
Figure 7:
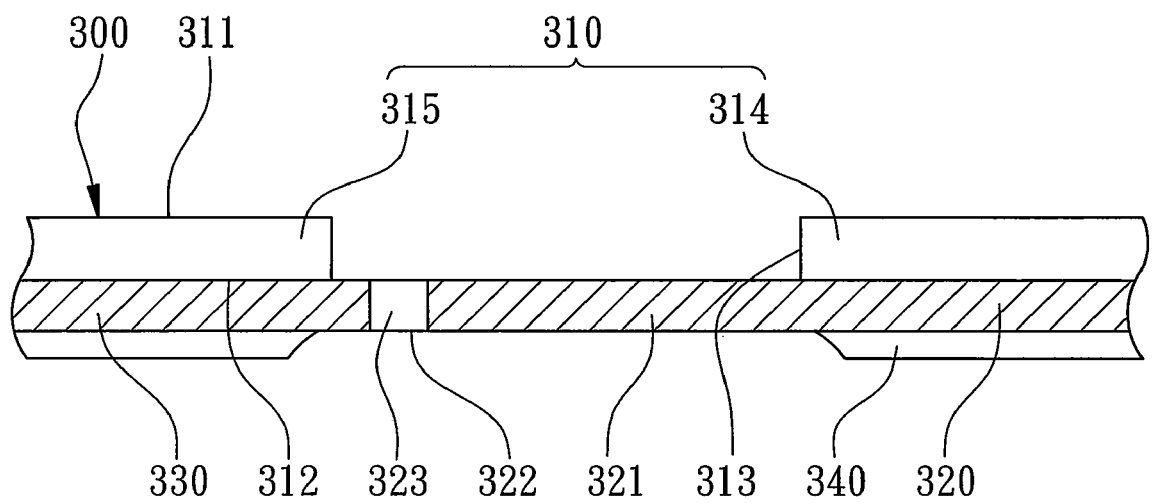
FIG. 7 is a partial cross-sectional view of a slot of a substrate of a micro-BGA package according to the preferred embodiment of the present invention.

As shown in FIG. 6, FIG. 7, and FIG. 8A, the assumed broken point 322 of the inner lead 321 are integrally connected to the second trace 330 and will not unexpectedly be broken before thermal compression bonding processes or ILB bonding processes. As shown in FIG. 8B, after breaking the inner lead 321, the inner lead 321 will be broken at the assumed broken point 322 and bent and bonded to the bonding pad 12. Comparing to the conventional electrical connections by wire bonding, the present invention has a shorter electrical path to achieve lower noise levels and shorter time delay leading to better electrical performance.

As shown in FIG. 6 and FIG. 8A, a non-circular through hole 323 is formed at the assumed broken point 322 through the inner lead 321. The through hole 323 has two symmetric V-notches 324 away from each other and facing toward both corresponding external sides 321A of the inner lead 321 where the shape of the non-circular through hole 323 can be chosen from the group consisting of rhombus, square, and olive-shaped. The non-circular through hole 323 vertically penetrates through the inner lead 321 from the top surface to the bottom surface as shown in FIG. 7, moreover, the peripheries of the non-circular through hole 323 is a closed-loop without extending to two corresponding external sides 321A of the inner lead 321 to form an indentation. The non-circular through hole 323 is formed by laser, mechanical drilling, or etching. Since the acute angles of the V-notch 324 is facing toward but without extending to the corresponding external sides 321A of the inner lead 321, therefore, two external sides of the inner lead 321 is flat at the assumed broken point 322, i.e. without forming a stress-concentrated point, so that the assumed broken point 322 of the inner lead 321 will not unexpectedly be broken where the non-circular through hole 323 can be enlarged if necessary. As shown in FIG. 8A, the angle of the V-notches 324 should be a right angle or an acute angle but not an obtuse angle. The width W2 of the through hole 323 between the two opposing V-notches 324 can not be smaller than half of the width W of the inner lead 321 so that the assumed broken point 322 of the inner lead 321 is much more easier to be broken under normal thermal compression. In the present embodiment, the width W3 at the assumed broken point 322 is equivalent to the average width W of the inner lead 321 and the width W2 of the through hole 323 is smaller than the width W of the inner lead 321 so that the through hole 323 can be formed within the inner lead 321. Through the through hole 323, the actual breaking distance, which is equivalent to the width W3 of the assumed broken point 322 minus the width W2 of the through hole 323, can be greatly reduced and divided into different sections, moreover, the V-notches 324 can control the direction of the crack so that the inner lead 321 can easily and accurately be broken at the assumed broken point 322 to generate a plurality of clean cracks under control, as shown in FIG. 8B.

As shown in FIG. 8B, during thermal compression processes of the inner lead 321, a thermal compression head 60 is aligned to aligned to the assumed bonding location 325 of the inner lead 321, i.e., the center of the slot 313 and pressed where the inner lead 321 will be broken at the assumed broken point 322 and bonded to the corresponding bonding pad 12 with a clean crack. Therefore, the assumed broken point 322 is easily broken during thermal compression processes. As shown in FIG. 6 and FIG. 8A, preferably, the through hole 323 can be adjacent to the second board part 315 to increase the lead length from the assumed bonding location 325 to the assumed broken point 322 of the inner lead 321, i.e., to increase the extended length of the inner lead 321 within the slot 313 so that even the thickness of the substrate 300 and/or the elastomer 350 changes, the inner lead 321 still has enough length to be bonded to the bonding pad 12 to enhance the quality of electrical connection.

Furthermore, in the present embodiment, the through hole 323 can be disposed adjacent to the second board part. In a different embodiment, the positions of the first trace 320 and the second trace 330 can be interchanged, as shown in FIG. 6, to change the location of the assumed broken point 322 where parts of the through hole 323 can be adjacent to the second board part 315 and the rest of the through hole 323 can be adjacent to the first board part 314 so that the inner lead 321 can be interlacedly bonded to the bonding pad 12 so that two opposing sides of the substrate 300 can be used for signal transmission.

As shown in FIG. 4 and FIG. 6 again, the substrate 300 further comprises a solder resist 340 formed on the bottom surface 312 of the substrate core 310 to cover the first trace 320 and the second trace 330. The solder resist 340 can be a liquid photo-sensitive solder resist (LPI), or a photo-sensitive cover layer (PIC), or non-photo-sensitive dielectric materials such as non-conductive printing ink or cover layer to provide surface isolation and protection to prevent the first trace 320 and the second trace 330 from contamination which may lead to electrical short. Additionally, the solder resist 340 functions as a fastener to avoid shift of the second trace 330 when the assumed broken point 322 is broken during thermal compression. Moreover, the substrate 300 further comprises an elastomer 350 formed on the top surface 311 of the substrate core 310 without covering the slot 313 to adhere and fix the chip 10 with stress relief functions. The elastomer 350 can be chosen from flexible B-stage paste, liquid paste, or PI tapes.

As shown in FIG. 4 again, the micro-BGA package 3 further comprises an encapsulant 40 formed on top of the substrate 300 to encapsulate the chip 10 and the inner lead 321 to provide protection from electrical short and contaminations.

Therefore, the formation of non-circular through hole 323 at the assumed broken point 322 of the inner lead 321 according to the present invention, the inner lead 321 can easily and accurately be broken at the assumed broken point 322. Since the through hole 323 has two symmetric V-notches 324 away from each other and facing toward two opposing external sides of the inner lead 321 so that two opposing external sides of the inner lead 321 do not have conventional V-notches cutting into the inner lead 321 from outside, referred to FIG. 3A and FIG. 8A so that the inner lead 321 will not unexpectedly be broken.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:
1. A substrate of a micro-BGA package, comprising:
a substrate core consisting of a first board part and a second board part to form a central slot therebetween;
a first trace disposed on the first board part and having a suspended inner lead extended into the slot, wherein the inner lead has an assumed broken point; and a second trace disposed on the second board part and is integrally connected to the inner lead at the assumed broken point;

wherein a non-circular through hole is formed at the assumed broken point through the inner lead, the hole has two symmetric V-notches away from each other and facing toward two opposing external sides of the inner lead.

2. The substrate as claimed in claim 1, wherein the through hole is adjacent to the second board part to increase the length of the inner lead from the assumed broken point.

3. The substrate as claimed in claim 1, wherein the width of the through hole between the two V-notches is not smaller than half of the width of the inner lead between the two opposing external sides.

4. The substrate as claimed in claim 1, wherein the angle of the V-notches is not greater than 90 degrees.

5. The substrate as claimed in claim 1, wherein the shape of the through hole is chosen from the group consisting of rhombus, square, and olive-shaped.

6. The substrate as claimed in claim 1, wherein the first trace and the second trace are formed from the same circuitry, wherein the circuitry further comprises an external pad electrically connected with the first trace.

7. The substrate as claimed in claim 6, wherein the first trace and the second trace are formed on a bottom surface of the substrate core.

8. The substrate as claimed in claim 1, wherein the substrate core is a flexible film.

9. The substrate as claimed in claim 1, further comprising a solder resist formed on the substrate core to cover the first trace and the second trace with the inner lead and the slot exposed.

10. The substrate as claimed in claim 9, further comprising an elastomer formed on the other surface of the substrate core opposing to the surface on which the first and second traces are formed.

11. A micro-BGA package comprising a substrate as claimed in claim 1 and a chip, wherein the active surface of the chip is attached to the substrate, the chip has a bonding pad on the active surface and aligned within the slot, wherein the inner lead is broken from the assumed broken point and bonded to the bonding pad through the slot.

12. The micro-BGA package as claimed in claim 11, wherein the first trace and the second trace are formed from the same circuitry, wherein the circuitry further comprises an external pad electrically connected to the first trace, wherein the micro-BGA package further comprises an external terminal jointed to the external pad.

13. The micro-BGA package as claimed in claim 12, wherein the first trace and the second trace are formed on a bottom surface of the substrate core.

14. The micro-BGA package as claimed in claim 12, wherein the external terminal is a solder ball.

15. The micro-BGA package as claimed in claim 11, further comprising an encapsulant formed on the substrate and in the slot to encapsulate the chip and the inner lead.

* * * * *